US009324923B2

(12) United States Patent
Li et al.

(10) Patent No.: US 9,324,923 B2
(45) Date of Patent: Apr. 26, 2016

(54) MULTIPLE-CHIP EXCITATION SYSTEMS FOR WHITE LIGHT EMITTING DIODES (LEDS)

(71) Applicant: Intematix Corporation, Fremont, CA (US)

(72) Inventors: Yi-Qun Li, Danville, CA (US); Gang Wang, Milpitas, CA (US); Li-De Chen, Kaohsiung (TW)

(73) Assignee: Intermatix Corporation, Fremont, CA (US)

( * ) Notice: Subject to any disclaimer, the term of this patent is extended or adjusted under 35 U.S.C. 154(b) by 172 days.

(21) Appl. No.: 14/045,765

(22) Filed: Oct. 3, 2013

(65) Prior Publication Data

US 2014/0027799 A1 Jan. 30, 2014

Related U.S. Application Data

(63) Continuation of application No. 12/398,059, filed on Mar. 4, 2009, now Pat. No. 8,567,973.

(60) Provisional application No. 61/034,699, filed on Mar. 7, 2008.

(51) Int. Cl.
*F21V 9/16* (2006.01)
*H01L 33/50* (2010.01)
(Continued)

(52) U.S. Cl.
CPC .......... *H01L 33/504* (2013.01); *C09K 11/0883* (2013.01); *C09K 11/7733* (2013.01);
(Continued)

(58) Field of Classification Search
CPC ........... C09K 11/0883; C09K 11/7733; C09K 11/7734; C09K 11/7739; C09K 11/7774; C09K 11/7792; F21K 9/00; H01L 33/504; H01L 33/50; H01L 33/502; H01L 33/0753; Y02B 20/181; F21V 9/16
See application file for complete search history.

(56) References Cited

U.S. PATENT DOCUMENTS 3,290,255 A 12/1966 Smith
3,294,699 A * 12/1966 Lange .................... 252/301.4 R
(Continued)

FOREIGN PATENT DOCUMENTS

EP 647694 4/1995
GB 2 017 409 10/1979
(Continued)

OTHER PUBLICATIONS

Office Action for Taiwanese Patent Application No. 098107448 dated Sep. 4, 2014.
"Fraunhofer-Gesellschaft: Research News Special1997", http://www.fhg.de/press/md-e/md1997/sondert2.hlm,(accessed on Jul. 23, 1998), Jan. 1997, Publisher: Fraunhofer Institute.

(Continued)

*Primary Examiner* — Alan Cariaso
(74) *Attorney, Agent, or Firm* — Vista IP Law Group, LLP

(57) ABSTRACT

Embodiments of the present invention are directed toward white light illumination systems (so called "white LEDs") that comprise a multi-chip excitation source and a phosphor package. In a two-chip source, the two LEDs may be UV-emitting and blue emitting, or blue-emitting and green-emitting. The phosphor package is configured to emit photoluminescence in wavelengths ranging from about 440 nm to about 700 nm upon co-excitation from the first and second radiation sources. The photoluminescence emitted by the phosphors is at least 40 percent of the total power in the white light illumination, and the portion of the total power in the white light illumination contributed by the first and second radiation sources (LEDs) is less than about 60 percent. This ratio can vary in alternative embodiments, and includes 50/50, 60/40, 70/30, and 80/20, respectively. The white light illumination emitted by the system has in one embodiment a color rendering index (CRI) greater than about 90.

20 Claims, 5 Drawing Sheets

(51) Int. Cl.
  *C09K 11/08* (2006.01)
  *C09K 11/77* (2006.01)
  *F21K 99/00* (2010.01)
  *H01L 25/075* (2006.01)

(52) U.S. Cl.
  CPC ......... *C09K11/7734* (2013.01); *C09K 11/7739* (2013.01); *C09K 11/7774* (2013.01); *C09K 11/7792* (2013.01); *F21K 9/00* (2013.01); *F21V 9/16* (2013.01); *H01L 25/0753* (2013.01); *H01L 33/50* (2013.01); *H01L 2924/0002* (2013.01); *Y02B 20/181* (2013.01)

(56) References Cited

U.S. PATENT DOCUMENTS

| | | |
|---|---|---|
| 3,593,055 A | 7/1971 | Geusic et al. |
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martie et al. |
| 3,763,405 A | 10/1973 | Mitsuhata |
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kana et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoberl |
| 4,176,294 A | 11/1979 | Thornton, Jr. |
| 4,176,299 A | 11/1979 | Thornton |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,959,316 A | 9/1999 | Lowery |
| 5,962,971 A | 10/1999 | Chen |
| 6,137,217 A | 10/2000 | Pappalardo et al. |
| 6,340,824 B1 | 1/2002 | Komoto et al. |
| 6,504,301 B1 | 1/2003 | Lowery |
| 6,576,488 B2 | 6/2003 | Collins et al. |
| 6,577,073 B2 | 6/2003 | Shimizu et al. |
| 6,600,175 B1 | 7/2003 | Baretz et al. |
| 6,642,618 B2 | 11/2003 | Yagi et al. |
| 6,642,652 B2 | 11/2003 | Collins et al. |
| 6,649,946 B2 * | 11/2003 | Bogner et al. ............... 257/233 |
| 6,869,812 B1 | 3/2005 | Liu |
| 7,005,679 B2 * | 2/2006 | Tarsa et al. ............... 257/89 |
| 7,153,015 B2 | 12/2006 | Brukilacchio |
| 7,311,858 B2 | 12/2007 | Wang et al. |
| 7,387,405 B2 | 6/2008 | Ducharme et al. |
| 7,476,338 B2 | 1/2009 | Sakane et al. |
| 7,479,662 B2 | 1/2009 | Soules et al. |
| 7,615,795 B2 | 11/2009 | Baretz et al. |
| 7,654,781 B2 | 2/2010 | McDuff et al. |
| 7,918,581 B2 | 4/2011 | Van de Ven et al. |
| 7,937,865 B2 | 5/2011 | Li et al. |
| 7,943,945 B2 | 5/2011 | Baretz et al. |
| 2002/0063301 A1 | 5/2002 | Hanamoto et al. |
| 2003/0006702 A1* | 1/2003 | Mueller-Mach et al. ...... 313/512 |
| 2004/0012027 A1* | 1/2004 | Keller et al. ............... 257/79 |
| 2004/0016938 A1 | 1/2004 | Baretz et al. |
| 2004/0135504 A1* | 7/2004 | Tamaki et al. ............... 313/512 |
| 2004/0239243 A1* | 12/2004 | Roberts et al. ............... 313/512 |
| 2006/0027781 A1 | 2/2006 | Dong et al. |
| 2006/0043337 A1 | 3/2006 | Sakane |
| 2006/0049416 A1 | 3/2006 | Baretz et al. |
| 2006/0067073 A1 | 3/2006 | Ting |
| 2006/0145123 A1* | 7/2006 | Li et al. ............... 252/301.4 F |
| 2006/0152140 A1 | 7/2006 | Brandes |
| 2006/0158090 A1* | 7/2006 | Wang et al. ............... 313/485 |
| 2007/0108455 A1 | 5/2007 | Sun et al. |
| 2007/0223219 A1 | 9/2007 | Medendorp et al. |
| 2007/0258240 A1 | 11/2007 | Ducharme et al. |
| 2007/0278934 A1 | 12/2007 | Van de Ven et al. |
| 2008/0136313 A1 | 6/2008 | Van de Ven et al. |
| 2008/0203900 A1 | 8/2008 | Chen et al. |
| 2008/0224597 A1 | 9/2008 | Baretz et al. |
| 2008/0224598 A1 | 9/2008 | Baretz et al. |

FOREIGN PATENT DOCUMENTS

| | | |
|---|---|---|
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |
| JP | 07-235207 | 9/1995 |
| JP | H7-282609 | 10/1995 |
| JP | H08-7614 | 1/1996 |

(56) References Cited

FOREIGN PATENT DOCUMENTS

| | | |
|---|---|---|
| JP | 8-250281 | 9/1996 |
| JP | 2900928 | 3/1999 |
| JP | P2003-234513 | 8/2003 |
| JP | P3724490 | 9/2005 |
| JP | P3724498 | 9/2005 |
| JP | 2006128456 A | 5/2006 |
| JP | 2007039571 A | 2/2007 |
| JP | 2007142389 A | 6/2007 |
| TW | I279929 | 4/2007 |
| TW | 200804720 A | 1/2008 |
| TW | 200812122 A | 3/2008 |
| WO | WO 9108508 | 6/1991 |
| WO | WO 2005109532 A1 | 11/2005 |

OTHER PUBLICATIONS

Adachi, C. et al., "Blue light-emitting organic electroluminescent devices", "Appl. Phys. Lett.", Feb. 26, 1990, pp. 799-801, vol. 56, No. 9.

Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.

Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.

Apr. 14, 2010 Office Action in U.S. Appl. No. 11/264,124.

Apr. 15, 2009 Office Action in U.S. Appl. No. 11/264.124, issued by Abu I Kalam.

Armaroli, N. et al., "Supramolecular Photochemistry and Photophysics.", "J. Am. Chern. Soc.", 1994, pp. 5211-5217, vol. 116.

Aug. 21, 2006 Office Action in U.S. Appl. No. 10/623,198, issued by Thao X. Le.

Aug. 24, 2007 Office Action in U.S. Appl. No. 11/264,124, issued by Thao X. Le.

Aug. 26, 2010 Office Action in U.S. Appl. No. 12/131,118.

Berggren, M. et al., "Light-emitting diodes with variable colours from polymer blends", "Nature", Dec. 1, 1994, pp. 444-446, vol. 372.

Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.

Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.

Bradfield, P.L., et al., "Electroluminescence from sulfur impurities in a p-n junction formed in epitaxial silicon", "Appl. Phys. Lett", 07110/1989, pp. 10D-102, vol. 55, No. 2.

Chao, Zhang Jin, et al., "White light emitting glasses", "Journal of Solid State Chemistry", 1991, pp. 17-29, vol. 93.

Comrie, M., "Full Color LED Added to Lumex's Lineup", "EBN", Jun. 19, 1995, p. 28.

CRC Handbook, 63rd Ed., (1983) p. E-201.

Das, N.C., et al., "Luminescence spectra of ann-channel metal-oxide-semiconductor field-effect transistor at breakdown", 1990, pp. 1152-1153, vol. 56, No. 12.

Dec. 16. 2004 Office Action in U.S. Appl. No. 10/623,198, issued by Thao X. Le.

Dictionary Definition of Phosphor, Oxford English Dictionary Online, Mar. 9, 2012 (Only partial available due to corrupt file on Mar. 22, 2012 in U.S. Appl. No. 12/131, 119; Request for Full Reference filed).

El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. No. 12/131,118, issued by Abul Kalam.

Feb. 26, 2008 Office Action in U.S. Appl. No. 11/264,124, issued by Abu I Kalam.

Feb. 4, 2005 Office Action in U.S. Appl. No. 10/623,198, issued by Thao X. Le.

Feb. 7, 2007 Office Action in U.S. Appl. No. 11/264,124, issued by Thao X. Le.

Forrest, S. et al., "Organic emitters promise a new generation of displays", "Laser Focus World", Feb. 1995, pp. 99-107.

Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Hamakawa, Yoshihiro, et al., "Toward a visible light display by amorphous SiC:H alloy system", "Optoelectronics—Devices and Technologies", Dec. 1989, pp. 281-294, vol. 4, No. 2.

Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.

Jang, S., "Effect of Avalanche-Induced Light Emission on the Multiplication Factor in Bipolar Junction Transistors", "Solid-State Electronics", 1991, pp. 1191-1196, vol. 34, No. 11.

Jan. 29, 2007 Office Action in U.S. Appl. No. 10/623,198, issued by Thao X. Le.

Jan. 30, 2006 Office Action in U.S. Appl. No. 11/264,124, issued by Thao X. Le.

Jan. 7, 2011 Office Action in U.S. Appl. No. 12/131,119, issued by Steven Y. Horikoshi.

Jul. 10, 2008 Office Action in U.S. Appl. No. 11/264,124, issued by Abu I Kalam.

Jul. 14, 2005 Notice of Allowance, Notice of Allowability, and Examiners Statement of Reasons for Allowance in U.S. Appl. No. 10/623,198, issued by Thao X. Le.

Jul. 14, 2011 Office Action in U.S. Appl. No. 12/131,119, issued by Steve Horikoshi.

Jul. 7, 2011 Office Action in U.S. Appl. No. 12/131,118, issued by Abu I Kalam.

Jun. 14, 2006 Office Action in U.S. Appl. No. 11/264,124, issued by Thao X. Le.

Jun. 26, 2007 Office Action in U.S. Appl. No. 10/623,198, issued by Thao X. Le.

Kido, J. et al., "1,2,4-Triazole Derivative as an Electron Transport Layer in Organic Luminescent Devices", "Jpn. J. Appl. Phys.", Jul. 1, 1993, pp. L917-L920, vol. 32.

Kido, J. et al., "Bright blue electroluminescence from poly(N-vinylcarbazole)", "Appl. Phys. Letters", Nov. 8, 1993, pp. 2627-2629, vol. 63, No. 19.

Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.

Krames, M., et al., "Status and Future of High-Power Light-Emitting Diodes for Solid-Slate Lighting", "Journal of Display Technology", Jun. 2007, pp. 160-175, vol. 3, No. 2.

Kudryashov, V., et al., "Spectra of Superbright Blue and Green InGaN/AlGaN/GaN Light-Emitting diodes", "Journal of the European Ceramic Society", May 1996, pp. 2033-2037, vol. 17.

Larach, S., et al., "Blue emitting luminescent phosphors: Review and status", "Int'l Workshop on Electroluminescence", 1990, pp. 137-143.

LEDs and Laser Diodes, Electus Distribution, copyright 2001, available at URL:http://www.jaycar.com.au/images_uploaded/ledlaser.Pdf.

Lester, S., et al., "High dislocation densities in high efficiency GaN-based light-emitting diodes", "Appl. Phys. Lett.", Mar. 6, 1995, pp. 1249-1251, vol. 66, No. 10.

Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn: documentum:eCommerce_soi_EU:09007bb280021e27.pdf :09007bb280021e27.pdf.

Mar. 2, 2009 Office Action in U.S. Appl. No. 10/623,198, issued by Abu I Kalam.

(56) References Cited

OTHER PUBLICATIONS

Mar. 22, 2012 Office Action in U.S. Appl. No. 12/131,119, issued by Steven Y. Horikoshi.
Mar. 28, 2006 Office Action in U.S. Appl. No. 10/623,198, issued by Thao X. Le.
Mar. 4, 2011 Notice of Allowance, Notice of Allowability, Examiners Interview Summary, Examiners Amendment/ Comment and Examiners Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.
May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.
Mimura, Hidenori, et al., "Visible electroluminescence from uc-SiC/porous Si/c-Si p-n junctions",, "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, p. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Nov. 30, 2010 Office Action in U.S. Appl. No. 12/131,118.
Oct. 20, 2008 Office Action in U.S. Appl. No. 10/623,198, issued by Abu I Kalam.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn a Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiners Amendmeni/Comment, and Examiners Statement of Reasons for Allowance in U.S. Appl. No. 10/623,198, issued by Abul Kalam.
Sep. 29, 2009 Office Action in U.S. Appl. No. 11/264,124, issued by Abu I Kalam.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M., "Recent trends of development of silicon monocarbide blue-light emission diodes", "Kinzoku", 1989, p. 11-15, vol. 59, No. 9.
Werner, K., "Higher Visibility for LEDs", "IEEE Spectrum", Jul. 1994, pp. 30-39.
Wojciechowski, J. et al., "Infrared-To-Blue Up-Converting Phosphor", "Electron Technology", 1978, pp. 31-47, vol. 11, No. 3.
Yamaguchi, Y. et al., "High-Brightness SiC Blue LEDs and Their Application to Full Color LED Lamps", "Optoelectronics—Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics—Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
Office Action for Chinese Patent Application No. 200980108036.9 dated Feb. 13, 2012.
Extended European Search Report for EP09718586.2, dated Oct. 21, 2011 (7 pages).
Commission Internationiale de l'Eclairage (CIE) Technical Report 13.3, 1995, Method of Measuring and Specifying Colour Rendering Properties of Light Sources.
Yen, William M., et al. "Inorganic Phosphors, Section 8: Commerical Phosphors and Scintillators and Appendix II", 2004 CRC Press, New York.
Office Action for Chinese Patent Application No. 200980108036.9 dated Jan. 14, 2013.
Office Action for European Application No. 09718586.2 dated Jan. 28, 2013.
Foreign Office Action dated Apr. 28, 2013 for Chinese Appln. No. 200980108036.9.
Foreign Office Action dated Jul. 9, 2013 for Japanese Appln. No. 2010-549890.
Japanese Office Action dated Feb. 12, 2014 for Japanese Patent Appln. No. 2010-549890.

* cited by examiner

MULTIPLE-CHIP EXCITATION SYSTEMS FOR WHITE LIGHT EMITTING DIODES (LEDS)

CLAIM OF PRIORITY

This application is a continuation of U.S. patent application Ser. No. 12/398,059, filed on Mar. 4, 2009, titled "Phosphor Systems for White Light Emitting Diodes (LEDs)," which claims priority to U.S. Provisional Patent Application No. 61/034,699, filed Mar. 7, 2008, titled "Phosphor Systems for White Light Emitting Diodes (LEDs)," all of which are incorporated herein by reference in their entireties.

BACKGROUND OF THE INVENTION

1. Field of the Invention

Embodiments of the present invention are directed in general to white LED illumination systems. More specifically, embodiments of the present invention are directed to white LED illumination systems comprising a multiple-chip (LED) excitation means for co-excitation of the members of a phosphor package included in the white light illumination system.

2. State of the Art

Devices known as "white LED's" are relatively recent innovations designed to replace the conventional incandescent light bulb. It was not until LED's emitting in the blue/ultraviolet region of the electromagnetic spectrum were developed that it became possible to fabricate a white light illumination source based on an LED. Economically, white LED's have the potential to replace incandescent light sources (light bulbs), particularly as production costs fall and the technology develops further. In particular, the potential of a white light LED is believed to be superior to that of an incandescent bulb in lifetime, robustness, and efficiency. For example, white light illumination sources based on LED's are expected to meet industry standards for operation lifetimes of 100,000 hours, and efficiencies of 80 to 90 percent. High brightness LED's have already made a substantial impact on such areas of society as traffic light signals, replacing incandescent bulbs, and so it is not surprising that they will soon provide generalized lighting requirements in homes and businesses, as well as other everyday applications. The term "white LED" may be something of a misnomer as no LED emits "white light," but it is used throughout the art to describe a lighting system where a blue/UV LED provides energy to another component of the system, one or more phosphors, which emit light when excited by the pumping LED, and where the excitation radiation from the pumping LED is combined with the light from the phosphor(s) to produce the final white light "product."

As described in U.S. Pat. No. 7,476,338 to Sakane et al., there are in the art generally two approaches to providing LED-based white light illumination systems. In a conventional multi-chip type system the three primary colors are provided by red, green, and blue LEDs individually. A one-chip system comprises a blue LED in conjunction with a phosphor where the blue LED serves two purposes: the first being to excite the phosphor, and the second to contribute blue light which is combined with the light emitted by the phosphor to make the perceived white light combination.

According to Sakane et al. the one-chip type system has a preferable characteristic in that an LED-phosphor system can be dimensionally smaller than a multi-chip system, and simpler in design because the multiple drive voltages and temperature considerations of multiple LEDs do not have to be taken into account. Thus the cost to manufacture the system may be reduced. Further, by using a phosphor having a broad emission spectrum, the white emission from the system better approximates the spectrum of sunlight, and thus the color rendering properties of the system may be improved. For these reasons greater attention has been given to the one-chip rather than multiple-chip type systems.

The single-chip type systems may further be divided into two categories. In a first category, as alluded to earlier, light from a high luminescence blue LED and a phosphor emitting a yellow color as a result of excitation from the blue LED is combined, the white luminescence of the combined light obtained by using a complementary relation between the blue emission of the LED and the yellow emission of the phosphor. In the second category, the excitation source is an LED that emits in the near-ultraviolet or ultraviolet (UV) region of the spectrum, and the light from the phosphor package may include a blue-emitting phosphor, red-emitting phosphor, and green-emitting phosphor is combined to form white light. In addition to being able to adjust the color rendering properties of the white light with this type of system, an arbitrary emission color may also be produced by controlling the mixing ratios of the red, green, and blue photoluminescence.

The benefits of these single-chip systems are well appreciated in the art, but so too are their drawbacks when it comes to enhancing color rendering properties. For example, the white light emission from a typical one-chip system consisting of a blue LED and a yellow phosphor (such as YAG:Ce) is deficient in the longer wavelength side of the visible spectrum, resulting in a bluish white light appearance. The YAG:Ce yellow phosphor of the system does not help much in contributing to the needed 600 to 700 nm emission content, since its excitation band with the greatest efficiency is at about 460 nm, and the excitation range of this yellow phosphor is not particularly broad. Further disadvantages of this single-chip system are the disparities in the emission wavelength ranges of the blue LED, due to in part to the manufacturing process, and if these deviate from the optimal excitation range of the YAG:Ce-based yellow phosphor, there results a loss of wavelength balance between the blue light and the yellow light.

There are also disadvantages to this second category of single-chip systems. White light illumination formed by combining the photoluminescence from a UV or near-UV excited red, green, and blue phosphor system is also deficient in the longer wavelengths because the excitation and emission efficiencies of the red phosphor are lower compared to that of the other phosphors in the package. The white LED designer therefore may have little choices available other than to increase the ration of the red phosphor in the mixture relative to the blue and green phosphors. But this action may lead to an undesirable consequence: the ratio of the green phosphor to the others may now be insufficient and luminescence from the white LED may suffer. It would appear that a white color with high luminescence is difficult to obtain. And the color rendering properties are still nowhere near optimum as the red phosphor typically has a sharper emission spectrum than the others.

It is clear that multi-chip white light illumination systems suffer from disadvantages, not the least of which is a need for a plurality of voltage control systems and the increased heat production from the many individual chips needed to produce the white light's component colors. But each of the single-chip systems have their problems too, perhaps most notably being the inability to achieve an acceptable color rendering outcome. What is needed in the art is a white light illumination system with enhanced luminosity and color rendering, while at the same time achieving a balance with the need for more sophisticated drive and control systems.

SUMMARY OF THE INVENTION

Embodiments of the present invention are directed toward white light illumination systems (so called "white LEDs") that comprise a multi-chip excitation source and a phosphor package (same as phosphor mixture). The multi-chip excitation source may be a two-chip source, a three-chip source, or excitation source for co-exciting a phosphor package where the radiation source contains more than three LEDs. In the case of a two-chip source, the two LEDs may be UV-emitting and blue emitting, or blue-emitting and green emitting. The three-chip source may contain a UV, blue, and green emitting source. There are essentially an infinite number of possibilities of chip combinations possible, but the essence of the concept is that the two-chip (or three-chip) source co-excites the phosphors in the phosphor package, and the multi-chip source and the phosphor package contribute varying amounts of power to the final white light illumination product.

In one embodiment, the source comprises a first radiation source emitting in wavelengths ranging from about 250 nm to about 410 nm, and a second radiation source for providing co-excitation radiation to the phosphor package, the source emitting in wavelengths ranging from about 410 nm to about 540 nm. This could be considered a two-chip source where the first source is a UV-emitting source, and the second source is a blue, blue-green, and/or green-emitting source. In another embodiment, the two-chip source comprises a first radiation source for providing co-excitation radiation to the phosphor package, the source emitting in wavelengths ranging from about 410 nm to about 480 nm; and a second radiation source for providing co-excitation radiation to the phosphor package, the source emitting in wavelengths ranging from about 480 nm to about 540 nm. This might be considered a two-chip source where the first chip is a blue-emitting LED, and the second chip is a green-emitting LED.

The phosphor package is configured to emit photoluminescence in wavelengths ranging from about 440 nm to about 700 nm upon co-excitation from the first and second radiation sources. The phosphor package includes at least one phosphor selected from the group consisting of a blue emitting phosphor, a green emitting phosphor, a yellow-green emitting phosphor, an orange emitting phosphor, and a red emitting phosphor, including combinations thereof. A large variety of phosphors are contemplated to be appropriate to carry out the present embodiments, and include aluminate-based phosphors, silicate-based phosphors, and nitride-based phosphors. This includes of course commercially available phosphors.

According to the present embodiments, the photoluminescence emitted by the phosphor package is at least 40 percent of the total power in the white light illumination, and the portion of the total power in the white light illumination contributed by the first and second radiation sources is less than about 60 percent. This ratio can vary in alternative embodiments, and includes 50 percent of the total power in the white light illumination, and the portion of the total power in the white light illumination contributed by the first and second radiation sources is less than about 50 percent, and systems where the ratio is 60/40, 70/30, and 80/20, respectively.

According to the present embodiments, the white light illumination emitted by the system has a color rendering index (CRI) greater than about 90. In alternative embodiments, the CRI is greater than about 80, and greater than about 70.

DETAILED DESCRIPTION OF THE INVENTION

Figure 1:
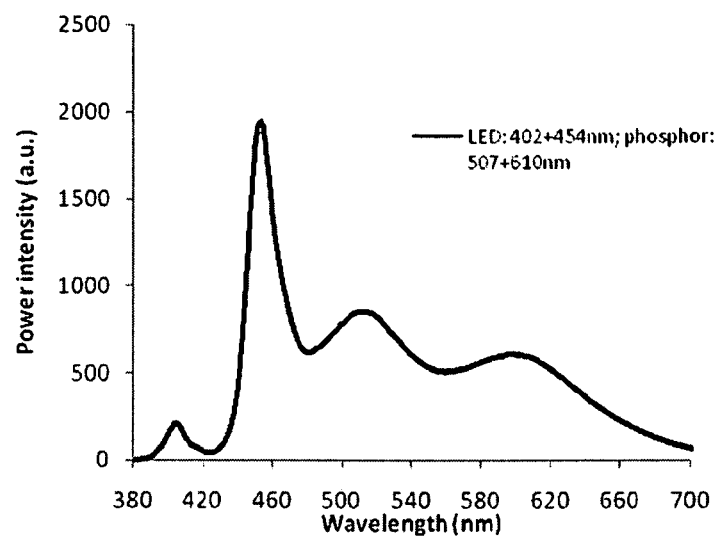
FIG. 1 is a plot of emission intensity versus wavelength for a two-LED radiation source providing excitation radiation to a two-phosphor system, the LEDs emitting at 402 and 454 nm, and the phosphors having peak emission intensities at 507 and 610 nm, respectively.

In one embodiment of the invention, the white LED is comprised of two radiation sources and at least two phosphors types chosen from blue, green, yellow, orange or red. The relative intensity of the two radiation sources can be equal, or tuned to a special ratio to optimize the final LED performance, such as the brightness, efficiency, color and the color rendering index (CRI).

Characterization of Light, Including White Light

One type of classification system developed to characterize the quality of white light was developed in 1965 by the Commission Internationale de l'Eclairage (CIE), and a summary of their recommendations has been reviewed by Ducharme et al. in U.S. Pat. No. 7,387,405. The CIE advised a measuring the color rendering properties of light sources based on a sample test color method. This method has been updated and is described in the CIE 13.3-1995 technical report titled "Method of Measuring and Specifying Color Rendering Properties of light sources," the disclosure of which is hereby incorporated by reference. In essence, the method involves the spectroradiometric measurement of the light source being tested. This data is multiplied by the reflectance spectrums of eight color sample. The resulting spectrums are then converted to tristimulus values based on the CIE 1931 standard observer. The shift of these values with respect to a reference light are determined for the uniform color space (UCS) recommended in 1960 by the CIE. The average of the eight color shifts is calculated to generate the General Color Rendering Index, known as the CRI. Within these calculations the CRI is scaled so that a perfect score equals 100, where "perfect" means using a source spectrally equal to a reference source (often sunlight and/or full spectrum light).

Artificial lighting generally uses the standard CRI to determine the quality of white light. If a white light yields a high CRI compared to sunlight and/or a full spectrum light, then it is considered to have a better quality in that it is more "natural," and more likely to enable a colored surface to better rendered. But in addition to providing better quality white light, it is also highly desirable to generate specific colors of light. Light tends to be more orange to red in the morning, and more blue in the night or evening, so the ability to change, fine-tune, or control a specific color or range of colors within the full spectrum is also important.

As taught by Ducharme et al. in U.S. Pat. Publication 2007/0258240, white light is a mixture of different wavelengths of light, and thus it is possible to characterize it based on the component colors used to generate it. Different colors may be combined to generate white light, including but not limited to: 1) red, green, and blue, 2) light blue, amber, and lavender, and 3) cyan, magenta, and yellow. In fact, a combination of only two colors may be combined to generate light that still appears white to the eye if these two chosen colors are so-called complementary, and an example of this is narrow band sources (LEDs, or in the extreme case, lasers) emitting around 635 nm and 493 nanometers. These artificial whites may appear white to the human eye, but in other ways inferior to full spectrum light and/or natural sunlight in that they will appear artificial when shown on a colored surface. The reason this happens is the colored surface under examination absorbs and reflects wavelength regions differentially. If such a surface is hit by full spectrum white light or natural sunlight, which means light having component wavelengths in the visible band fully represented at reasonable and/or desired intensities, the surface will absorb and reflect perfectly. But the artificial white lights described in this paragraph having only two or three components do not contain the complete spectrum. To give an example of what different color rendering means in two different situations: a surface that reflects in the 500 to 550 nm range will appear deep-green under full spectrum light, but black under the hypothetical "white light" generated by the hypothetical two component system comprising two narrow band sources emitting at around 635 nm and 493 nanometers.

Optical Results

Figure 2:
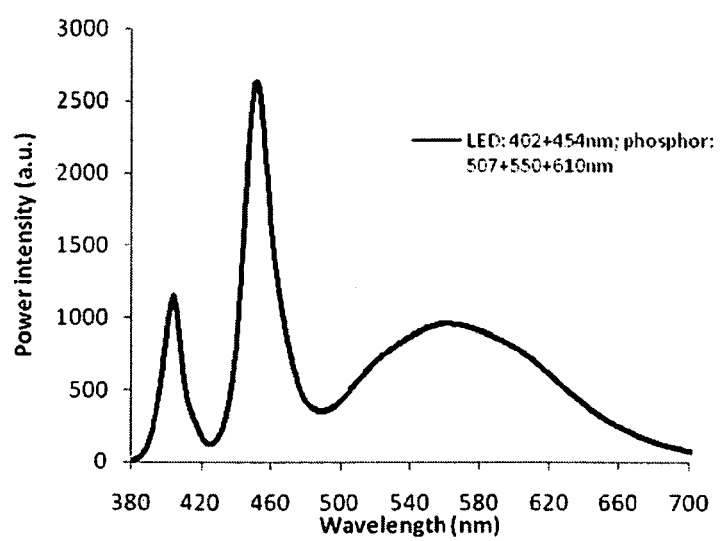
FIG. 2 is a plot of emission intensity versus wavelength for a two-LED radiation source providing excitation radiation to a three-phosphor system, the LEDs emitting at 402 and 454 nm, and the phosphors having peak emission intensities at 507, 550, and 610 nm, respectively.

The optical results to be discussed in this section will be quantified by way of graphs that plot emission intensity of the system as a function of spectral wavelength. It is, in fact, convenient to start with the spectrum of a conventional blue LED plus yellow YAG:Ce phosphor, as exemplified by Chen et al. in U.S. Pat. Publication 2008/0203900. Their FIG. 1 shows that the spectrum is deficient in red but especially so in the green. They suggest adding LEDs that preferably emit light in the blue-green region of the spectrum; i.e. 480 to 500 nm, and in the amber-red region of the spectrum; i.e. 580 to 680 nm. Their FIG. 2 shows a spectrum that is obtained by adding a blue-green LED having a center wavelength of approximately 500 nm to the white light system whose elimination was shown in their FIG. 1.

The addition of this LED by Chen et al. produces a spectrum that is substantially more constant in luminosity as a function of wavelength than that of the two component blue LED and yellow phosphor (e.g. YAG:Ce) system. The spectrum from a three LED—one phosphor system is shown in their FIG. 3, where a third LED emitting from 580 to 680 nm has been added to the system. The intensity of this spectrum over a range 450 to 650 nm is substantially more constant than the single LED/single phosphor (e.g., blue LED/YAG:Ce yellow phosphor) or two component version of a white LED. The power in the second, blue-green LED and/or third, orange-red LED is a small fraction of the power in the first blue LED that provides blue light as well as excitation radiation to the yellow phosphor, and thus the overall efficiency of the system has only been slightly reduced, yet the overall color rendering ability of the three component system has been enhanced. Thus multiple LEDs have been shown to be effective from an overall efficiency point of view.

Though LEDs in addition to the traditional blue LED have been used in white light illumination systems, these supplementary LEDs are used to provide a component of light to the final white light product, and (to the inventors knowledge) not to provide an additional source of excitation radiation. The term "co-excitation" as used herein will mean that at least two different LEDs provide a combined excitation radiation covering two different wavelengths or wavelength ranges to a phosphor and/or phosphor mixture (also called phosphor package), which may include two or more phosphors. The at least two LEDs each provides excitation radiation to the phosphor package, and may include a combination of any of a UV or near-UV LED and a blue, green, or yellow LED, and even an orange LED if it is configured to excite a red phosphor. In fact, that is a principle of the embodiments of the present invention: an LED may be used to excite any phosphor whose excitation energy is equal to or less than the bandgap energy of the LED in question, or stated more generally, an LED emitting at a certain wavelength may excite a phosphor whose luminescence is at a wavelength lower in energy than that of the LED's emission. So a green LED, for example, may be used to excite a yellow phosphor, or perhaps more efficiently, an orange or red phosphor; this event happening in conjunction with the conventional blue LED exciting a yellow phosphor (and possibly also a green, orange or red phosphor, etc.).

The first three examples of the present embodiments are directed to a system comprising two excitation LEDs: the first radiation source emitting excitation radiation to a phosphor package in wavelength ranging from about 250 to 410 nm, and thus it might be considered a UV to near-UV LED, and a second radiation source emitting light in a wavelength ranging from 410 to 480 nm, and so this excitation source is substantially the same as the conventional blue LED used in blue LED/yellow phosphor systems. The phosphor mixtures tested with this two-LED excitation configuration are built up in the following manner: in the first example the phosphor package is a green and an orange phosphor; in the second example it is a green, yellow, and orange phosphor; and in the third example it is a blue, green, yellow, and orange phosphor. The members of this phosphor package each emit in the 440 to 700 nm wavelength range. The innovative concept in this embodiment is the use of a UV excitation LED in addition to the conventional blue LED, both LEDs simultaneously providing excitation radiation to the phosphors. With regards to the phosphor package to which the UV and blue LED sources are providing excitation radiation, a wide variety of choices are available. But some phosphors, such as silicate-based phosphor having high quantum efficiency as the excitation wavelength decreases from 470 to 250 nm as taught by the inventors of the present disclosure, result in a an enhanced luminosity (brightness) achieved via the UV light source. Another advantage of using UV light source is that a phosphor with a shorter emission wavelength may be used to effectively absorb the UV light rather than the blue light from the excitation sources, such that the luminescence spectrum of the final product may cover a broader range of wavelengths, thus increasing the CRI value.

The results of the UV and blue LED excitation chips used in conjunction with a green phosphor designated G507 and an orange phosphor designated O610 are shown in FIG. 1. More will be said about the phosphors, particularly their compositions, later in this disclosure, but for now it will be noted that in this nomenclature, the letter is the color, and the number represents the wavelength at peak emission for that particular phosphor. The relative ratio of two phosphors was chosen to achieve a target CIE having x, y values close to (0.3, 0.3). So that other chip combinations and phosphor mixtures may be compared in a meaningful manner, the same CIE targets were chosen for the remaining nine examples. Thus brightness and CRI may be directly compared. In this first example the brightness was 31.32, and the CRI was 91.8, which shows immediately that color renderings over 90 CRI may be achieved with the present embodiments.

In the second example a yellow phosphor designated Y550 was added to the green and orange mix (G507 and O610, respectively) discussed previously in the first example. FIG. 2 shows the emission spectrum from a white LED utilizing the same UV and blue LED chip sources from the first example (402 nm and 454 nm). This time blue/UV LEDs co-exciting a yellow, green, and orange phosphor package produced white light illumination with more than a 30% increase in brightness. This increase in brightness was achieved via the addition of the yellow phosphor, as substantially all the other variables of the experiments were held constant. The white light produced in this second example may be characterized as having a brightness of 40.64, and a CRI of 80.7.

Unlike the first example that involved a mixture of two phosphors, in this second embodiment with a three-phosphor mixture in the phosphor package, there is created an essentially infinite number of blending ratios that can achieve the same target CIE. Generally, the addition of a yellow phosphor provided the advantage on high brightness, while the green and orange phosphors work advantageously to increase the CRI. In other words, optimization of the CRI value and the brightness may be achieved separately by fine tuning the ratio of the yellow phosphor concentration to that of the orange and green phosphors.

Figure 3:
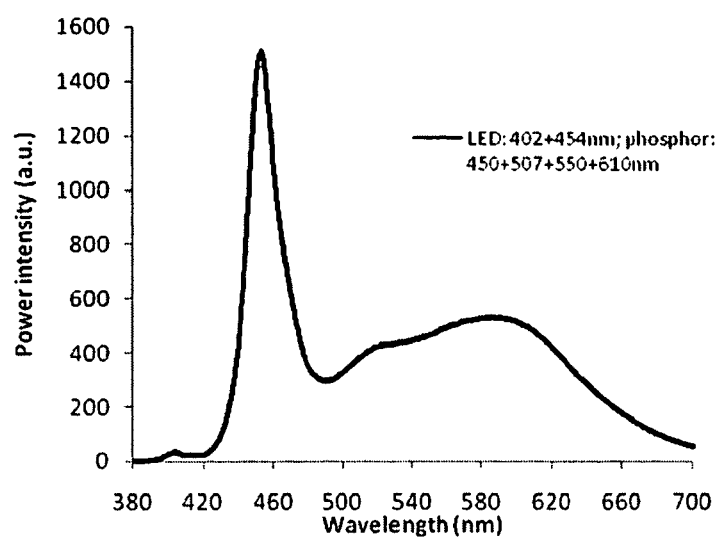
FIG. 3 is a plot of emission intensity versus wavelength for a two-LED radiation source providing excitation radiation to a four-phosphor system, the LEDs emitting at 402 and 454 nm, and the phosphors having peak emission intensities at 450, 507, 550, and 610 nm, respectively.

In the third example, a blue phosphor designated B450 was added to the green, yellow, and orange mix (G507, Y550, O610, respectively) discussed in the second example. FIG. 3 shows the emission spectrum from a white LED utilizing the same UV and blue LED chip sources as in the first and second examples (402 nm and 454 nm). The brightness was 23.62, the CRI 89.1. The blue phosphor effectively absorbs the UV light from this multi-chip excitation source, while being substantially transparent to the blue light from the blue LED, allowing it to co-excite the yellow, green, and orange phosphors in the system. It should be noted that the blue phosphor used in this particular test demonstrated less than 50% quantum efficiency at the 402 nm excitation wavelength, and it is contemplated that a greater than 30% increase in brightness may be achieved with blue phosphors that have a 70% quantum efficiency.

In the fourth and fifth examples of the present embodiments, a different chip set was used. Here, the two chips provided co-excitation radiation at wavelengths centered at 429 and 457 nm, respectively. These are examples of a two-chip co-excitation source where the first radiation source emits light in a wavelength ranging from 410 to 440 nm, and where the second radiation source emits light at wavelengths ranging from 440 to 480. So whereas the chip set in the first three examples might be described as a UV and blue combination, the chip set in the fourth and fifth examples are a purple (could also be described as violet) LED and blue LED set. The purple LED emits at 429 nm, which is just at the shortest end of the spectrum where the human eye is able to detect illumination. The other LED is a blue LED which emits at 457 nm, substantially the same as that used in the conventional white LED (blue LED/YAG:Ce). The blue and purple multi-chip set was used to provide co-excitation radiation to two different phosphor packages, as described below.

In the fourth example the phosphor package contained two phosphors, one green and one orange (G507, and O610, respectively). The two phosphors in this package photoluminesce at wavelengths ranging from 480 to 700 nm. The 410 to 440 nm radiation will contribute light itself to final white light illumination product, and thus determine at least in part the color and brightness of the white light, in contrast to the chip set containing the UV LED. On the other hand, it demonstrates a greater efficiency in exciting yellow and green phosphors, so the major advantage of such a combination is to allow the use of shorter emission wavelength phosphors in order to achieve high CRI value while maintaining brightness.

Figure 4:
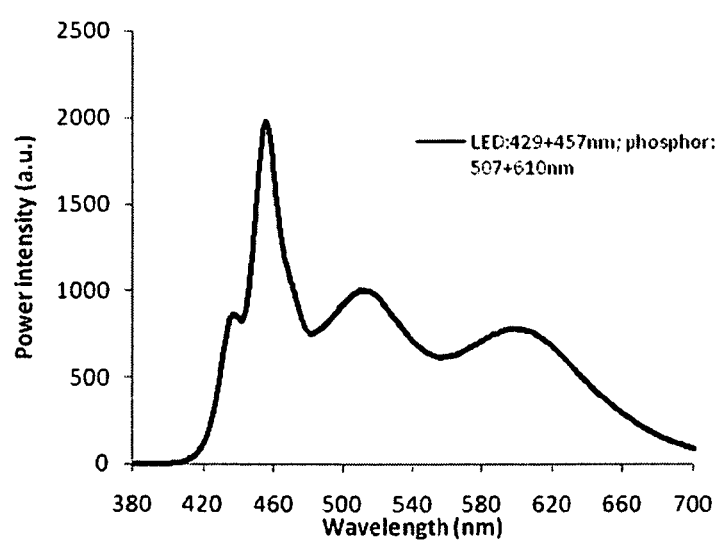
FIG. 4 is a plot of emission intensity versus wavelength for a two-LED radiation source providing excitation radiation to a three-phosphor system, the LEDs emitting at 402 and 454 nm, and the phosphors having peak emission intensities at 507 and 610 nm, respectively.

A spectrum of the white light illumination from this system is shown in FIG. 4. The brightness of the illumination was 38.37, and the CRI was 92.0.

Figure 5:
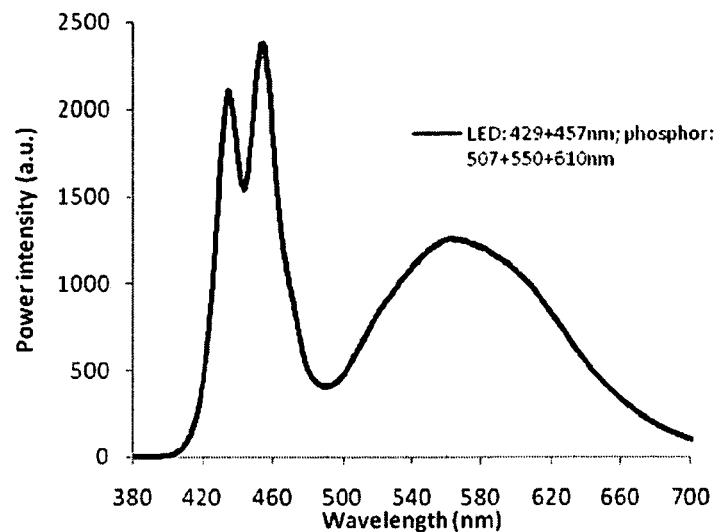
FIG. 5 is a plot of emission intensity versus wavelength for a two-LED radiation source providing excitation radiation to a three-phosphor system, the LEDs emitting at 429 and 457 nm, and the phosphors having peak emission intensities at 507, 550, and 610 nm, respectively.

In the fifth example a yellow phosphor designated Y550 was added to the green and orange mix (G507 and O610, respectively) discussed previously in the fourth example. FIG. 5 shows the emission spectrum from a white LED utilizing the same purple and blue LED chip radiation sources from the first example (429 nm and 457 nm, respectively, representing radiation sources of 410 to 440 nm, and 440 to 480 nm sources, respectively). This time the purple/blue LEDs co-exciting a yellow, green, and orange phosphor package produced white light illumination with more than a 30% increase in brightness. As in the transition from the second to third examples, this increase in brightness from the fourth to fifth examples was achieved via the addition of the yellow phosphor, as substantially all the other variables of the experiments were held constant, and optimization of the CRI value and the brightness may be achieved separately by fine tuning the ratio of the yellow phosphor concentration to that of the orange and green phosphors. The white light produced in this second example may be characterized as having a brightness of 52.0, and a CRI of 79.9.

The multi-chip excitation source in the first five examples was either a UV/blue combination or a purple/blue combination. High brightness, high CRI white light illumination sources can be provided by using a blue chip and green chip with a phosphor package having two phosphors in one embodiment, and three phosphors in another. These phosphors can be any combination of a green phosphor such as G530, a yellow phosphor such as Y550), an orange phosphor such as O590, and a red phosphor such as R662. In this sixth example, the chip set was a blue LED in combination with a green LED. So in example three the white LED comprised a first radiation source emitting light in wavelength ranging from 440 to 480 nm, and a second radiation source co-exciting a phosphor package, the second radiation source emitting light in wavelengths ranging from 480 to 540 nm. This chip set provided co-excitation radiation to at least two types of phosphors emitting light in wavelength range from 500 to 700 nm. More specifically, the mixed phosphors in the system exemplified by the sixth embodiment contained a green and orange phosphor (G530 and O590), where an orange or red phosphor is included because of the 480 to 540 nm emitting blue-green LED. Some orange and red phosphors, such as silicate-based phosphors, have a higher quantum efficiency as the excitation wavelength increases from 440 to 550 nm, so the use of green excitation radiation increases the efficiency of an orange and/or red phosphor so as to achieve higher brightness. The further addition of other green and/or yellow phosphor can broaden the final LED emission wavelength spectrum, thus increase the CRI value.

Figure 6:
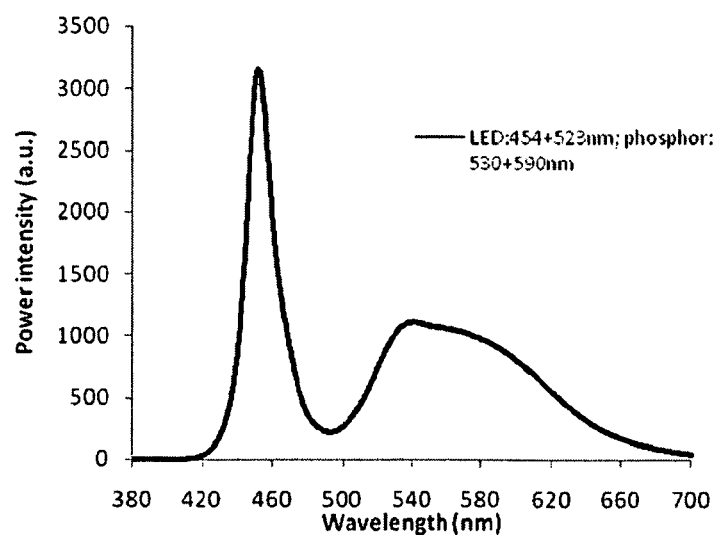
FIG. 6 is a plot of emission intensity versus wavelength for a two-LED radiation source providing excitation radiation to a two-phosphor system, the LEDs emitting at 454 and 523 nm, and the phosphors having peak emission intensities at 530 and 590 nm, respectively.

FIG. 6 shows a white LED made from a chip set comprising a 454 nm LED and a 523 nm LED, this chip set providing co-excitation radiation to a phosphor package comprising a 530 nm green phosphor and a 590 nm orange phosphor. The brightness was 43.92, and the CRI value 71.9; again, the brightness and/or CRI values may be optimized by using different phosphors, and by tuning the respective intensities of the green versus blue LEDs.

Table 1 summarizes the testing results of the white light illumination systems of FIGS. 1-6, where the CIE coordinates have been substantially fixed at x and y values of 0.3 and 0.3 respectively, and where the white light is characterized by brightness and CRI values.

TABLE 1

| Phosphor | LED | CIE x | CIE y | Brightness (a.u.) | CRI |
|---|---|---|---|---|---|
| G507 + O610 | 402 nm + 454 nm | 0.286 | 0.304 | 31.32 | 91.8 |
| G507 + Y550 + O610 | 402 nm + 454 nm | 0.303 | 0.300 | 40.64 | 80.7 |
| B450 + G507 + Y550 + O610 | 402 nm + 454 nm | 0.307 | 0.294 | 23.62 | 89.1 |
| G507 + O610 | 429 nm + 457 nm | 0.302 | 0.302 | 38.37 | 92.0 |
| G507 + Y550 + O610 | 429 nm + 457 nm | 0.309 | 0.293 | 52.07 | 79.9 |
| G530 + O590 | 454 nm + 523 nm | 0.295 | 0.301 | 43.92 | 71.9 |

For comparison to these multi-chip systems, a similar set of experiments was carried out with a single-chip excitation source. The LEDs in these single-chip examples emitted excitation radiation in a wavelength ranging from 250 nm to 440 nm; they were in the seventh through tenth examples: 402, 402, 417, and 429 nm, respectively. The phosphor packages were different combinations of blue, green and orange phosphors. Specifically they were blue, green, and orange in the seventh example; blue, green, yellow, and orange in the eighth example; green, yellow, and orange in the ninth example, and green and orange in the tenth example.

Figure 7:
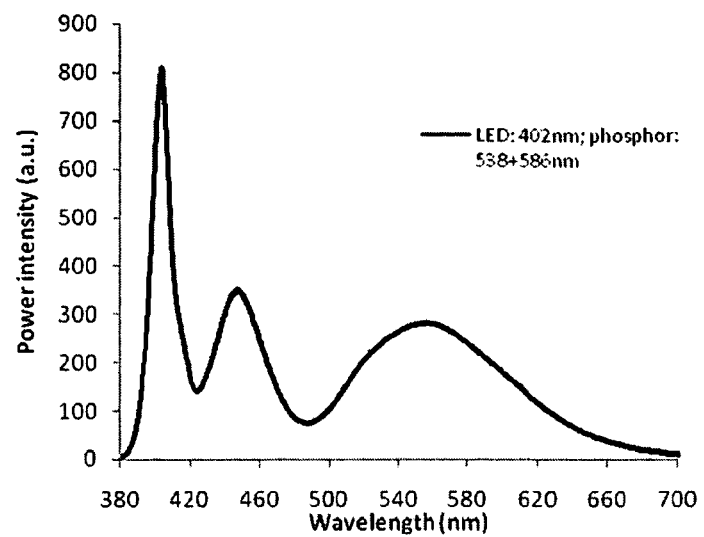
FIG. 7 is a plot of emission intensity versus wavelength for a single LED radiation source providing excitation radiation to a two-phosphor system, the LED emitting at 402 nm, and the phosphors having peak emission intensities at 538 and 586 nm, respectively.

FIG. 7 shows the emission spectrum from a white LED made constructed using from a 402 nm LED, a 450 nm blue phosphor, a 538 nm blue-green phosphor, and a 586 nm orange phosphor. The blue phosphor used in had less than a 50% quantum efficiency at the 402 nm excitation wavelength, and more than a 30% increase in brightness could be achieved with a blue phosphor having a 70% quantum efficiency. The brightness was 10.63; the CRI 64.7.

Figure 8:
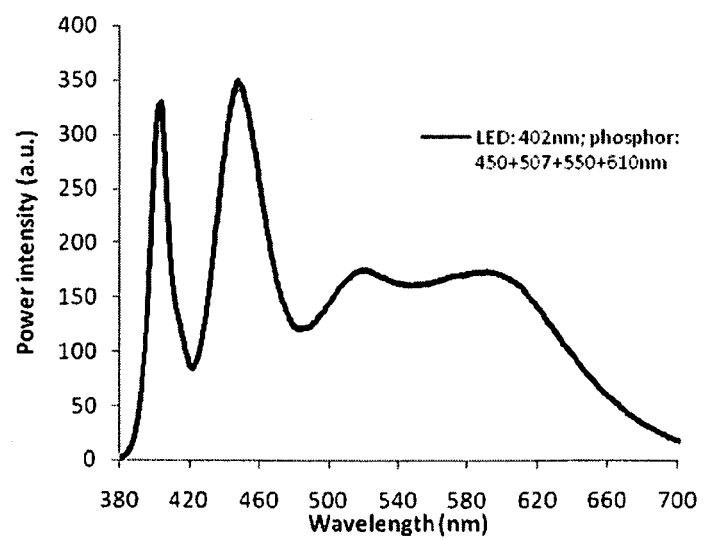
FIG. 8 is a plot of emission intensity versus wavelength for a single LED radiation source providing excitation radiation to a four-phosphor system, the LED emitting at 402 nm, and the phosphors having peak emission intensities at 450, 507, 550, and 610 nm, respectively.

FIG. 8 shows the emission spectrum from a white LED constructed from a 402 nm LED, a 450 nm blue phosphor, a 507 nm blue-green phosphor, a 550 nm yellow phosphor, and a 610 nm orange phosphor. The brightness was 8.29 and the CRI was 91.7.

Figure 9:
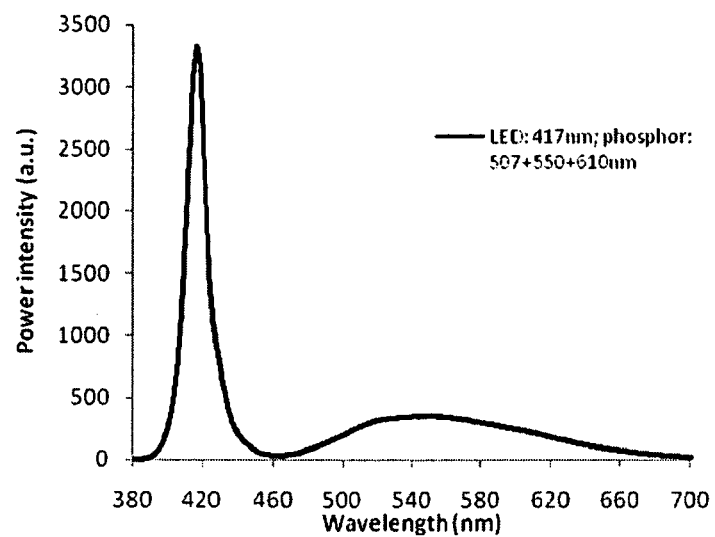
FIG. 9 is a plot of emission intensity versus wavelength for a single LED radiation source providing excitation radiation to a three-phosphor system, the LED emitting at 402 nm, and the phosphors having peak emission intensities at 507, 550, and 610 nm, respectively.

FIG. 9 shows the emission spectrum from a white LED made constructed from a 417 nm LED, a 507 nm blue-green phosphor, a 550 nm yellow phosphor and a 610 nm orange phosphor. The brightness was 14.53 and the CRI was 62.8.

Figure 10:
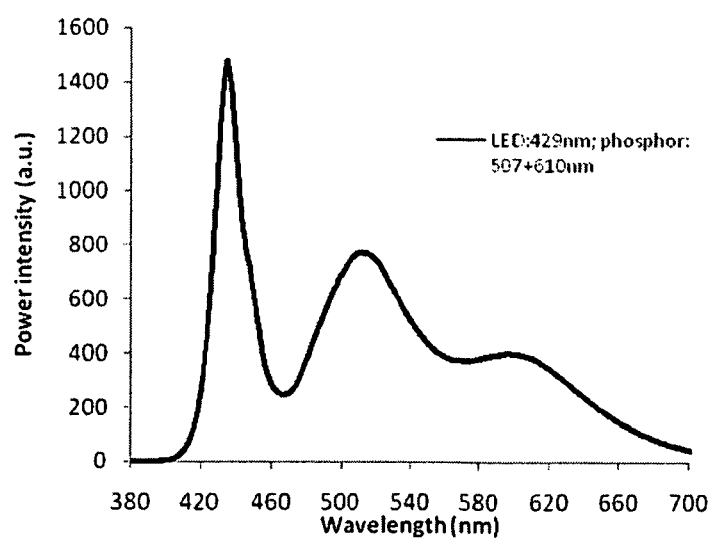
FIG. 10 is a plot of emission intensity versus wavelength for a single LED radiation source providing excitation radiation to a two-phosphor system, the LED emitting at 429 nm, and the phosphors having peak emission intensities at 507 and 610 nm, respectively.

FIG. 10 shows the emission spectrum from a white LED made constructed from a 429 nm LED, a 507 nm blue-green phosphor, and a 610 nm orange phosphor. The brightness was 23.98, and the CRI was 86.8.

Table 2 summarizes the testing results of the white light illumination systems of FIGS. 7-10, where the CIE coordinates have been substantially fixed at x and y values of 0.3 and 0.3 respectively, and where the white light is characterized by brightness and CRI values.

TABLE 2

| Phosphor | LED | CIE x | CIE y | Brightness (a.u.) | CRI |
|---|---|---|---|---|---|
| B450 + G538 + O586 | 402 nm | 0.304 | 0.335 | 10.63 | 64.7 |
| B450 + G507 + Y550 + O610 | 402 nm | 0.301 | 0.298 | 8.29 | 91.7 |
| G507 + Y550 + O610 | 417 nm | 0.296 | 0.301 | 14.53 | 62.8 |
| G507 + O610 | 429 nm | 0.275 | 0.312 | 23.98 | 86.8 |

In yet another embodiment of the present invention, a white LED is comprises a first radiation source emitting excitation radiation in a wavelength ranging from about 250 nm to about 440 nm, a second radiation source emitting excitation radiation in a wavelength ranging from about 440 nm to about 480 nm, and a phosphor package comprising an yellow-orange phosphor having a peak emission wavelength ranging from about 540 to 600 nm, and/or a red phosphor having a peak emission wavelength ranging from about 580 to about 780 nm.

Exemplary Phosphor Compositions

The advantages of the present multi-chip excitation sources are not restricted to any particular type of phosphor. Indeed, it is contemplated that virtually any of the commercial blue, green, yellow, orange, and red phosphors listed in Section 8 and Appendix II of Inorganic Phosphors, by William M. Yen and Marvin J. Weber (CRC Press, New York, 2004). Section 8 and Appendix II of this reference is therefore incorporated herein by reference in their entirety.

Examples of the blue, blue-green, yellow, yellow-orange, orange, and red phosphors that are suitable to carry out the teachings of the present embodiments include the aluminates, silicates, and nitrides (and mixtures thereof) that have been developed by the present inventors. Although the present embodiments are not restricted to the following definitions, it is true that for the examples in the disclosure the blue phosphors tended to be aluminate-based; the green phosphors could be either aluminates or silicates, the yellow and orange phosphors tended to be silicate-based, albeit with different types of host structures; and the red phosphors are nitrides.

An exemplary blue aluminate-based phosphor has the general formula $(M_{1-x}Eu_x)_{2-z}Mg_zAl_yO_{[2+(3/2)y]}$, where M is a divalent alkaline earth metal other than magnesium (Mg) from group IIA of the periodic table, where $0.05<x<0.5$; $3 \le y \le 12$; and $0.8 \le y \le 1.2$. The composition may contain a halogen dopant, such as fluorine or chlorine. M may be either Ba (barium) or Sr (strontium); when M is Ba, the phosphor is a member of the present barium aluminate magnesium (BAM) series; when M is strontium, the phosphor is a member of the present strontium magnesium aluminate (SAM) series. The halogen dopant may reside on oxygen lattice sites within the crystalline lattice host, and is present in an amount ranging from about 0.01 to 20 mole percent. The phosphor in this example is configured to absorb radiation in a wavelength ranging from about 280 nm to about 420 nm, and to emit visible light having a wavelength ranging from about 420 nm to 560 nm.

An exemplary phospho-chloride that may be used as the blue phosphor in the present embodiments, and the phosphor B450 that was used to generate the data in FIGS. 3, 7, and 8 has the formula $Sr_{10}(PO_4)_6Cl_2:Eu_{0.05}$.

It is reiterated that the types of phosphors or the specific phosphors are not the key to the embodiments of the present invention; rather, it is that the at least two LEDs in the system are there substantially to provide excitation radiation to the at least one phosphor in the phosphor package, and not to provide light to the final illumination product. Thus it is contemplated that virtually any phosphor(s) will work, and this includes commercially available phosphors. Commercially available blue phosphors that may be used according to the present embodiments include (CeMg)SrAl$_{11}$O$_{18}$:Ce, (CeMg)BaAl$_{11}$O$_{18}$:Ce, YAlO$_3$:Ce$^{3+}$, Ca$_2$MgSi$_2$O$_7$:Ce$^{3+}$, Y$_2$SiO$_5$:Ce$^{3+}$, Zn$_2$SiO$_4$:Ti, CsI:Na$^+$, Sr$_2$P$_2$O$_7$:Eu, Sr$_5$Cl(PO$_4$)$_3$:Eu, BaMgAl$_{10}$O$_{17}$:Eu,Mn (BAM), and ZnS:Ag,Cl,Ni. These phosphors emit at wavelengths up to about 460 nm.

The green phosphors may be either aluminate or silicate-based, or a combination of both. The aluminate-based green phosphors may represented by the general formula $M_{1-x}Eu_xAl_yO_{1+3y/2}$, where M is at least one of a divalent metal selected from the group consisting of Ba, Sr, Ca, Mg, Mn, Zu, Cu, Cd, Sm, and Tm; $0.1<x<0.9$; and $0.5 \le y \le 12$. These aluminate-based green phosphors are configured to absorb substantially non-visible radiation having a wavelength ranging from about 280 to 420 nm, and emit visible green light having a wavelength ranging from about 500 to 550 nm. In a particular embodiment, the phosphor contains the divalent alkaline earth metals Mg, and Mn may be present as well.

The silicate-based green phosphors appropriate for the present white LEDs using multi-chip co-excitation sources have the general formula $(Sr,A_1)_x(Si,A_2)(O,A_3)_{2+x}:Eu^{2+}$, where A$_1$ is at least one of a divalent 2+ alkaline earth or transition metal cation selected from the group consisting of Mg, Ca, Ba, and Zn, wherein the stoichiometric amount of A$_1$ varies from 0.3 to 0.8, both inclusive; A$_2$ is P, B, Al, Ga, C, and Ge; and A$_3$ is a anion including a halogen selected from the group consisting of F and Cl, but also included are Br, C, N, and S. The formula is written to indicate that the A$_1$ cation replaces Sr; the A$_2$ cation replaces Si, and the A$_3$ anion replaces O. The amounts of A$_2$ and A$_3$ each range from 0 to 19 mole percent, both endpoints inclusive; and x is any value between 1.5 and 2.5. A$_1$ could also include a combination of 1+ and 3+ cations, the 1+ cations including Na, K, and Li, and the 3+ cations including Y, Ce, and La.

Exemplary silicates that may be used as the green phosphors in the present embodiments and designated G507 in FIGS. 1, 2, 3, 4, 5, 8, 9, and 10 has the formula $Ba_{1.96}Mg_{0.04}Eu_{0.06}Si_{1.03}O_4Cl_{0.12}$. The phosphor designated G530 in FIG. 6 has the formula $Sr_{1.03}Ba_{0.92}Mg_{0.05}Eu_{0.06}Si_{1.03}O_4Cl_{0.12}$. The phosphor designated G538 in FIG. 7 has the formula $Sr_{1.15}Ba_{0.80}Mg_{0.05}Eu_{0.06}Si_{1.03}O_4Cl_{0.12}$. Another formula for an appropriate silicate-based green phosphor (not shown in the figures) is G525: $Sr_{0.925}Ba_{1.025}Mg_{0.05}Eu_{0.06}Si_{1.03}O_4Cl_{0.12}$.

Commercially available green phosphors that may be used according to the present embodiments include Bi$_4$Ge$_3$O$_{12}$, Ca$_5$(PO$_4$)$_3$F:Sb, (Ba,Ti)$_2$P$_2$O$_7$:Ti, Sr$_5$(PO$_4$)$_3$F:Sb,Mn, ZnO:Zn, ZnS:Cu,Cl, Zn$_2$SiO$_4$:Mn$^{2+}$, and Y$_3$Al$_5$O$_{12}$:Ce$^{3+}$. These phosphors emit at wavelengths roughly between about 480 and 530 nm, and the designation of this range as being "green," as opposed to "blue-green" or "yellow-green" is arbitrary and not particularly important.

An exemplary silicate-based yellow-green phosphor has the general formula $A_2SiO_4:Eu^{2+}D$, wherein A is at least one of a divalent metal selected from the group consisting of Sr, Ca, Ba, Mg, Zn, and Cd; and D is a dopant selected from the group consisting of F, Cl, Br, I, P, S and N. The dopant D is present in the phosphor in an amount ranging from zero to about 20 mole percent. In another embodiment, the phosphor has the formula $(Sr_{1-x-y}Ba_xM_y)_2SiO_4:Eu^{2+}F$, Cl, where M is one of Ca, Mg, Zn, or Cd in an amount ranging from $0<y<0.5$.

An exemplary silicate that may be used as the yellow phosphor in the present embodiments, and the phosphor Y550 that was used to generate the data in FIGS. 2, 3, 5, 8, and 9 has the formula $Sr_{1.34}Ba_{0.61}Mg_{0.05}Eu_{0.06}Si_{1.03}O_4Cl_{0.12}$. A YAG:Ce$^{3+}$ phosphor may also be used to provide the yellow component. Another silicate-based phosphor (not shown in the figures) has the designation EY4453 and formula $Sr_{1.46}Ba_{0.45}Mg_{0.05}Eu_{0.1}Si_{1.03}O_4Cl_{0.18}$.

Commercially available yellow phosphors that may be used according to the present embodiments include ZnS:Pb,Cu, ZnS:Ag,Cu,Cl, Y$_3$Al$_5$O$_{12}$:Tb$^{3+}$, (Ce,Tb)MgAl$_{11}$O$_{19}$:Ce,Tb, Y$_3$Al$_5$O$_{12}$:Ce$^{3+}$, MgF$_2$:Mn$^{2+}$, CsI:Tl, and (Zn,Mg)F$_2$:Mn$^{2+}$. These phosphors emit at wavelengths roughly between about 530 and 590 nm, and the designation of this range as being "yellow," as opposed to "yellow-green" or "yellow-orange" is arbitrary and not particularly important.

Silicate-based orange phosphors appropriate for the present multi-chip white LEDs have the general formula $(Sr,A_1)_x(Si,A_2)(O,A_3)_{2+x}:Eu^{2+}$, where A$_1$ is at least one divalent cation (a 2+ ion) including Mg, Ca, and Ba, or a combination of 1+ and 3+ cations, where 1+ cations include Na, K, and Li, and the 3+ cations include Y, Ce, and La; A$_2$ is a 3+, 4+, or 5+ cation, including at least one of B, Al, Ga, C, Ge, P; A$_3$ is a 1-, 2-, or 3-anion, including F, Cl, and Br as 1-anions; and x is any value between 2.5 and 3.5, inclusive. Again, the formula is written to indicate that the A$_1$ cation replaces Sr; the A$_2$ cation replaces Si, and the A$_3$ anion replaces O. A$_1$ varies stoichiometrically from 0.3 to 0.8, both inclusive, and the amounts of A$_2$ and A$_3$ each range from 0 to 19 mole percent, both endpoints inclusive. In another embodiment, the silicate-based orange phosphors have the formula $(Sr_{1-x}M_x)_yEu_zSiO_5$, wherein M is at least one of a divalent metal selected from the group consisting of Ba, Mg, Ca, and Zn; $0 \le x \le 0.5$; $2.6 \le y \le 3.3$; and $0.001 \le z \le 0.5$. These phosphors too may contain halogen dopants such as F and Cl. These orange phosphors may be excited by any of the LED sources emitting in the UV, blue, green, and/or yellow regions of the spectrum.

Exemplary silicates that may be used as the orange phosphor in the present embodiments and designated O590 in FIG. 6 has the formula $Ba_{0.02}Sr_{2.94}Eu_{0.1}Si_{1.02}O_5F_{0.2}$. The orange silicate designated O610 in FIGS. 1, 2, 3, 4, 5, 8, 9, and 10 has the formula $(Sr_{0.87}Ba_{0.1}Y_{0.0167})_3Eu_{0.1}Si_{0.97}Al_{0.05}O_5F_{0.2}$. Another silicate-based orange phosphor that is appropriate in the present multi-chip co-excitation embodiments (not shown in the figures) has the designation O586 and the formula $Sr_3Eu_{0.06}Si_{1.02}O_5F_{0.18}$.

Commercially available orange phosphors that may be used according to the present embodiments include $(Y,Gd)BO_3:Eu^{3+}$, $Y(P,V)O_4:Eu3+$, $(Zn,Mg)F_2:Mn^{2+}$, $(Ca,Zn,Mg)_3(PO_4)_2:Sn$, $CaSiO_3:Mn^{2+},Pb$, $Y_2O_3:Eu^{3+}$, and $YVO_4:Eu^{3+}$. These phosphors emit at wavelengths roughly between about 590 and 620 nm, and the designation of this range as being "orange," as opposed to "yellow-orange" or "orange-red" is arbitrary and not particularly important.

Red phosphors that may be used according to the present embodiments typically have nitride-based hosts. A general formula that may be used to describe such nitride-based red phosphor is $M_mM_aM_b(N,D)_n:Z_z$, where $M_m$ is a divalent element; $M_a$ is a trivalent element; $M_b$ is a tetravalent element; N is nitrogen; Z is an activator; and D is a halogen; and where the stiochiometry of the constituent elements (m+z):a:b:n is about 1:1:1:3, and the phosphor is configured to emit visible light having a peak emission wavelength greater than about 640 nm. Another formula that may be used to describe the present nitride-based red phosphor is $M_mM_aM_bD_{3w}N_{[(2/3)m+z+a+(4/3)b-w]}Z_z$, where $M_m$ is a divalent element selected from the group consisting of Be, Mg, Ca, Sr, Ba, Zn, Cd, and Hg; $M_a$ is a trivalent element selected from the group consisting of B, Al, Ga, In, Y, Sc, P, As, La, Sm, Sb, and Bi; $M_b$ is a tetravalent element selected from the group consisting of C, Si, Ge, Sn, Ni, Hf, Mo, W, Cr, Pb, Ti, and Zr; D is a halogen selected from the group consisting of F, Cl, Br, and I; Z is an activator selected from the group consisting of Eu, Ce, Mn, Tb, and Sm; N is nitrogen. The amounts of the constituent elements may be described by the following parameters: $0.01 \le m \le 1.5$; $0.01 \le a \le 1.5$; $0.01 \le b \le 1.5$; $0.0001 \le w \le 0.6$, and $0.0001 \le z \le 0.5$.

In an alternative embodiment, the nitride-based red phosphors have the formula $M_aM_bM_c(N,D)_n:E_z$, where Ma is not just a single divalent element, but rather a combination of two or more divalent elements (or two divalent elements used simultaneously). The two divalent metals may be, for example, Ca and Sr. Examples of such phosphors are $Ca_{0.98-x}Sr_xAlSiN_3Eu_{0.02}$, $Ca_{0.98-x}Sr_xAlSiN_3Eu_{0.02}$, $Ca_{0.98-x}Sr_xAlSiN_3Eu_{0.02}$ and $Ca_{0.98-x}Sr_xAlSiN_3Eu_{0.02}$, where x ranges from 0 to 0.98. A nitride-based red phosphor that is appropriate for use in the present multi-chip co-excitation embodiments (the red phosphor not shown in the figures) has the designation R662 and the formula $Ca_{0.97}AlSiN_3Eu_{0.0}Cl_{0.1}$.

Commercially available red phosphors that may be used according to the present embodiments include $(Sr,Mg)_3(PO_4)_2:Sn$, $(Sr,Mg)_3(PO_4)_2:Sn$, $Zn_{0.4}Cd_{0.6}S:Ag$, $Zn_3(PO_4)_2:Mn^{2+}$, $MgSiO_3:Mn^{2+}$, and $Mg_4(F)(Ge,Sn)O_6:Mn^{2+}$. These phosphors emit at wavelengths roughly greater than about 620 nm.

LED Chips Providing Co-excitation

The LED chips that provide the excitation radiation to the phosphor package in the present embodiments are in some cases based on indium gallium nitride, with various In to Ga ratio ($In_xGa_{1-x}N$), x varying from about 0.02 to about 0.4 for the blue emitting chips, and x greater than about 0.4 for the green emitting chips. The value of x separating the blue emitting chips from the green emitting chips is somewhat arbitrary; it is the actually emission wavelength that is important, and not the description of its color (which may be subjective). But it will be understood that higher values of x corresponds to longer wavelengths of excitation. Blue LED chips may also be based on zinc selenide (ZnSe). Green emitting LED chips may be any of the materials gallium phosphide (GaP), aluminium gallium indium phosphide (AlGaInP), and aluminium gallium phosphide (AlGaP). Green emitting chips may be mixtures of InGaN and GaN.

What is claimed is:

1. A white light illumination system comprising a multi-chip excitation source and a phosphor package, the multi-chip excitation source comprising:
   a first radiation source for providing UV co-excitation radiation to the phosphor package, the first radiation source emitting in wavelengths ranging from about 250 nm to about 410 nm;
   a second radiation source for providing blue co-excitation radiation to the phosphor package, the second radiation source emitting in wavelengths ranging from about 410 nm to about 480 nm; and
   a phosphor package configured to emit photoluminescence in wavelengths ranging from about 440 nm to about 700 nm upon co-excitation from the first and second radiation sources, wherein the phosphor package includes a green emitting aluminate-based phosphor;
   wherein the phosphor package further including a red emitting phosphor, the red emitting phosphor comprises a nitride-based red phosphor; and the nitride-based red phosphor is of a general formula $M_mM_aM_b(N,D)_n:Z_z$, where $M_m$ is a divalent element; $M_a$ is a trivalent element; $M_b$ is a tetravalent element; N is nitrogen; Z is an activator; and D is a halogen; and where stiochiometry of constituent elements (m+z):a:b:n is about 1:1:1:3.

2. The white light illumination system of claim 1, wherein the green emitting aluminate-based phosphor is of a general formula $M_{1-x}Eu_xAl_yO_{1+3y/2}$, where M is at least one of a divalent metal selected from the group consisting of Ba, Sr, Ca, Mg, Mn, Zu, Cu, Cd, Sm, and Tm; $0.1 < x < 0.9$; and $0.5 \le y \le 12$.

3. The white light illumination system of claim 1, wherein $M_a$ is a combination of two or more divalent elements.

4. The white light illumination system of claim 3, wherein $M_a$ comprises Ca and Sr.

5. The white light illumination system of claim 4, wherein the nitride-based red phosphor comprises at least one of $Ca_{0.98-x}Sr_xAlSiN_3Eu_{0.02}$; $Ca_{0.98-x}Sr_xAlSiN_3EU_{0.02}$; $Ca_{0.98-x}Sr_xAlSiN_3Eu_{0.02}$; and $Ca_{0.98-x}Sr_xAlSiN_3Eu_{0.02}$, where x ranges from 0 to 0.98.

6. The white light illumination system of claim 1, wherein the phosphor package further includes at least one phosphor selected from the group consisting of a blue emitting phosphor, a yellow-green emitting phosphor, an orange emitting phosphor, and combinations thereof.

7. The white light illumination system of claim 1, further comprising a third radiation source for providing green co-excitation radiation to the phosphor package, the third radiation source emitting in wavelengths ranging from about 480 nm to about 540 nm.

8. The white light illumination system of claim 1, wherein the white light illumination emitted by the system has a color rendering index (CRI) greater than about 90.

9. The white light illumination system of claim 1, wherein the photoluminescence emitted by the phosphor package is at least 40 percent of the total power in the white light illumination, and the portion of the total power in the white light illumination contributed by the first and second radiation sources is less than about 60 percent.

10. The white light illumination system of claim 1, wherein the photoluminescence emitted by the phosphor package is at least 70 percent of the total power in the white light illumination, and the portion of the total power in the white light illumination contributed by the first and second radiation sources is less than about 30 percent.

11. A white light illumination system comprising a multi-chip excitation source and a phosphor package, the multi-chip excitation source comprising:

a first radiation source for providing UV co-excitation radiation to the phosphor package, the first radiation source emitting in wavelengths ranging from about 250 nm to about 410 nm;

a second radiation source for providing blue co-excitation radiation to the phosphor package, the second radiation source emitting in wavelengths ranging from about 410 nm to about 480 nm; and a phosphor package configured to emit photoluminescence in wavelengths ranging from about 440 nm to about 700 nm upon co-excitation from the first and second radiation sources, wherein the phosphor package includes a green emitting aluminate-based phosphor;

wherein the phosphor package further including a red emitting phosphor, the red emitting phosphor comprises a nitride-based red phosphor; and the nitride-based red phosphor is of a general formula $M_m M_a M_b D_{3w} N_{[(2/3)m+z+a+(4/3)b-w]} Z_z$, where $M_m$ is a divalent element selected from the group consisting of Be, Mg, Ca, Sr, Ba, Zn, Cd, and Hg; $M_a$ is a trivalent element selected from the group consisting of B, Al, Ga, In, Y, Sc, P, As, La, Sm, Sb, and Bi; $M_b$ is a tetravalent element selected from the group consisting of C, Si, Ge, Sn, Ni, Hf, Mo, W, Cr, Pb, Ti, and Zr; D is a halogen selected from the group consisting of F, Cl, Br, and I; Z is an activator selected from the group consisting of Eu, Ce, Mn, Tb, and Sm; N is nitrogen and wherein $0.01 \leq m \leq 1.5$; $0.01 \leq a \leq 1.5$; $0.01 \leq b \leq 1.5$; $0.0001 \leq w \leq 0.6$, and $0.0001 \leq z \leq 0.5$.

12. The white light illumination system of claim 11, wherein the phosphor package further includes at least one phosphor selected from the group consisting of a blue emitting phosphor, a yellow-green emitting phosphor, an orange emitting phosphor, and combinations thereof.

13. The white light illumination system of claim 11, further comprising a third radiation source for providing green co-excitation radiation to the phosphor package, the third radiation source emitting in wavelengths ranging from about 480 nm to about 540 nm.

14. The white light illumination system of claim 11, wherein the white light illumination emitted by the system has a color rendering index (CRI) greater than about 90.

15. The white light illumination system of claim 11, wherein the photoluminescence emitted by the phosphor package is at least 40 percent of the total power in the white light illumination, and the portion of the total power in the white light illumination contributed by the first and second radiation sources is less than about 60 percent.

16. The white light illumination system of claim 11, wherein the photoluminescence emitted by the phosphor package is at least 50 percent of the total power in the white light illumination, and the portion of the total power in the white light illumination contributed by the first and second radiation sources is less than about 50 percent.

17. The white light illumination system of claim 11, wherein the photoluminescence emitted by the phosphor package is at least 60 percent of the total power in the white light illumination, and the portion of the total power in the white light illumination contributed by the first and second radiation sources is less than about 40 percent.

18. The white light illumination system of claim 11, wherein the photoluminescence emitted by the phosphor package is at least 70 percent of the total power in the white light illumination, and the portion of the total power in the white light illumination contributed by the first and second radiation sources is less than about 30 percent.

19. The white light illumination system of claim 11, wherein the photoluminescence emitted by the phosphor package is at least 80 percent of the total power in the white light illumination, and the portion of the total power in the white light illumination contributed by the first and second radiation sources is less than about 20 percent.

20. The white light illumination system of claim 11, wherein the green emitting aluminate-based phosphor is of a general formula $M_{1-x} Eu_x Al_y O_{1+3y/2}$, where M is at least one of a divalent metal selected from the group consisting of Ba, Sr, Ca, Mg, Mn, Zu, Cu, Cd, Sm, and Tm; $0.1 < x < 0.9$; and $0.5 \leq y \leq 12$.

* * * * *